United States Patent
Parihar et al.

(10) Patent No.: US 7,588,990 B2
(45) Date of Patent: Sep. 15, 2009

(54) DYNAMIC SURFACE ANNEALING OF IMPLANTED DOPANTS WITH LOW TEMPERATURE HDPCVD PROCESS FOR DEPOSITING A HIGH EXTINCTION COEFFICIENT OPTICAL ABSORBER LAYER

(75) Inventors: Vijay Parihar, Fremont, CA (US); Christopher Dennis Bencher, San Jose, CA (US); Rajesh Kanuri, Santa Clara, CA (US); Marlon E. Menezes, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 348 days.

(21) Appl. No.: 11/692,778

(22) Filed: Mar. 28, 2007

(65) Prior Publication Data
US 2008/0057681 A1 Mar. 6, 2008

Related U.S. Application Data

(60) Provisional application No. 60/841,851, filed on Aug. 31, 2006.

(51) Int. Cl.
H01L 21/336 (2006.01)
(52) U.S. Cl. ............ 438/301; 438/308; 438/482; 438/485; 438/487; 257/E21.049
(58) Field of Classification Search ......... 438/301–308, 438/482–492; 257/E21.041, E21.049
See application file for complete search history.

(56) References Cited

U.S. PATENT DOCUMENTS

| | | | |
|---|---|---|---|
| 6,423,384 B1 | 7/2002 | Khazeni et al. | 427/577 |
| 6,987,240 B2 | 1/2006 | Jennings et al. | 219/121.8 |
| 7,015,124 B1 | 3/2006 | Fisher et al. | 438/586 |
| 2005/0074986 A1 | 4/2005 | Autryve et al. | 438/795 |
| 2007/0093033 A1* | 4/2007 | Wang et al. | 438/303 |

* cited by examiner

Primary Examiner—H. Jey. Tsai
(74) Attorney, Agent, or Firm—Law Office of Robert M. Wallace

(57) ABSTRACT

A plasma enhanced physical vapor deposition process deposits an amorphous carbon layer on an ion-implanted wafer for use in dynamic surface annealing of the wafer with an intense line beam of a laser wavelength. The deposition process is carried out at a wafer temperature below the dopant clustering threshold temperature, and includes introducing the wafer into a chamber and furnishing a hydrocarbon process gas into the chamber, preferably propylene ($C_3H_6$) or toluene ($C_7H_8$) or acetylene ($C_2H_2$) or a mixture of acetylene and methane ($C_2H_4$). The process further includes inductively coupling RF plasma source power into the chamber while and applying RF plasma bias power to the wafer. The wafer bias voltage is set to a level at which the amorphous carbon layer that is deposited has a desired stress (compressive or tensile). We have discovered that at a wafer temperature less than or equal to 475 degrees C., total RF plasma source power of 4000 Watts at about 2 MHz, RF plasma bias power of 2000-3000 Watts at about 13.56 MHz and a chamber pressure in a range of 3 mTorr to 2 Torr, the deposited amorphous carbon layer has a surprising combination of high absorption and high strength and excellent step coverage.

19 Claims, 4 Drawing Sheets

DYNAMIC SURFACE ANNEALING OF IMPLANTED DOPANTS WITH LOW TEMPERATURE HDPCVD PROCESS FOR DEPOSITING A HIGH EXTINCTION COEFFICIENT OPTICAL ABSORBER LAYER

CROSS-REFERENCE TO RELATED APPLICATIONS

This application claims the benefit of U.S. Provisional Application Ser. No. 60/841,851, filed Aug. 31, 2006.

BACKGROUND OF THE INVENTION

High speed integrated circuits formed on a crystalline semiconductor wafer have ultra shallow semiconductor junctions formed by ion implanting dopant impurities into source and drain regions. The implanted dopant impurities are activated by a high temperature anneal step which causes a large proportion of the implanted atoms to become substitutional in the crystalline semiconductor lattice. Such a post-ion implantation anneal step is performed using a dynamic laser surface anneal process in which a thin line of intense radiation is scanned in a direction transverse to the line across the wafer surface. The scanning rate of the line beam is sufficiently great so that heating of the wafer (to a temperature between 1150 to 1350 degrees C.) is limited to an extremely shallow depth below the surface and to an extremely narrow region corresponding to the thin laser line beam. The narrow region temporarily expands.

The dynamic surface anneal process employs an array of diode lasers whose multiple parallel beams are focused along a narrow line (e.g., about 300 microns wide) having a length less than the wafer diameter or radius. The diode lasers have a wavelength of about 810 nm. The narrow laser beam line is scanned transversely across the wafer surface (e.g., at a rate between 30 mm/sec to 300 mm/sec), so that each point on the wafer surface is exposed for a very short time (e.g., between 0.25 millisec to 5 millisecs). This type of annealing is disclosed in United States Patent Publication No. US 2003/0196996A1 (Oct. 23, 2003) by Dean C. Jennings et al. Each region of the wafer surface reaches a temperature range of about 1150-1300 degrees C. for about 50 microsec to 3 millisec. The depth of this region is about 10-20 microns. This depth is sufficient because it extends well-below the ultra-shallow semiconductor junction depth of about 200 Angstroms. Such a high temperature is sufficient to activate the implanted (dopant) atoms and to anneal lattice damage or defects. Some of these defects like end of range defects may require laser exposure time of 1 mellisec to 3 millisec above 1150-1350 degrees C., to fully or to partially resolve end of range defects to a level where their presence does not impact device performance. The optical absorption of the laser radiation must be uniform across the wafer surface for uniform dopant activation.

The problem is that the underlying thin film structures formed on the wafer surface present different optical absorption characteristics and different optical emissivities in different locations on the wafer surface. This makes it difficult if not impossible to attain uniform anneal temperatures across the wafer surface. This problem can be solved by depositing an optical absorption layer over the entire wafer surface that uniformly absorbs the laser radiation and then conducts the heat to the underlying semiconductor wafer. Such a film must withstand the stress of heating during the laser anneal step without damage or separation, and must be selectively removable after the laser anneal step with respect to underlayers and must not contaminate or damage the underlying semiconductor wafer or thin film features. The problem of withstanding stress arises from the thermal expansion of the narrow laser-illuminated portion of the wafer surface. Further, the absorber film must attain excellent step coverage (high degree of conformality) over the underlying thin film features.

An amorphous carbon material is the best choice for the optical absorber layer, as suggested in U.S. Patent Publication No. 2005/0074986, filed Jan. 15, 2004 by Luc Van Autryve et al. entitled "Absorber Layer for DSA Processing" and assigned to the present assignee, which discloses a plasma enhanced chemical vapor deposition (PECVD) process for depositing the amorphous carbon layer. One advantage of amorphous carbon is that it is readily removed with high selectivity by oxidation at a low wafer temperature. Another advantage is that carbon is generally compatible with semiconductor plasma processes and therefore does not involve contamination, so long as excessive implantation does not occur.

One problem is that the deposited layer is vulnerable to cracking or peeling under the high temperatures of the laser anneal step, unless the layer is deposited at a very high temperature (e.g., 550 degrees C.). Unfortunately, such a high temperature causes clustering of the implanted dopant atoms during the deposition step itself. Such clustered dopant atoms resist separation during the subsequent laser anneal step, limiting the fraction of the implanted atoms that move during the laser anneal step into substitutional sites in the crystal. This results in unacceptably high sheet resistance in the source or drain regions.

These issues are not problems in the fabrication of semiconductor structures with larger (e.g., 65 nm) feature sizes. This is because the larger gate-source overlap (20 nm) permitted for such larger structures can be annealed by conventional thermal (flash lamp) annealing (prior to deposition of the optical absorber layer). This anneal step is then followed by the dynamic surface (laser) anneal step to obtain a fractional improvement in dopant activation. This improvement is limited because the thermal annealing causes a small amount of dopant clustering which the subsequent laser annealing step cannot undo. The 45 nm devices require better dopant activation, which requires elimination of the thermal annealing step and maintaining wafer temperatures below the threshold (475 degrees C.) at which dopant clustering can occur until the laser anneal step is performed. This results in extremely high dopant activation levels and low sheet resistance in the implanted areas, as required for 45 nm device structures. The requirement to maintain the wafer temperature below the dopant clustering threshold temperature is critical in the 45 nm process (unlike the 65 nm process) because none of the implanted dopant atoms have been moved into substitutional crystal sites prior to laser annealing (since the thermal annealing step is not permitted), so that any elevation of the wafer temperature prior to laser annealing (e.g., during the amorphous carbon layer deposition) threatens to cluster all of the dopant atoms, which would make it impossible to obtain sufficient dopant activation even by laser annealing.

Attempting to avoid this problem by reducing the wafer temperature (e.g., below 475 degrees C.) during PECVD deposition of the absorber layer creates two problems. First, the mechanical properties of the deposited amorphous carbon layer formed at this lower temperature are inferior so that it will fail (by cracking, peeling or separation from the wafer) during the laser annealing step. Secondly, the amorphous carbon layer deposited at the lower temperature has inferior or insufficient optical absorption qualities (low extinction coefficient) at the 810 nm wavelength of the laser anneal step. The lower extinction coefficient requires a thicker optical absorber (amorphous carbon) layer to attain 90-99% absorption of the laser power. The increased thickness increases the susceptibility of the absorber layer to peel or separate during the dynamic laser anneal step. The extinction coefficient may be so low that the amorphous carbon layer is transparent to the 810 nm laser light regardless of thickness, and therefore is not functional.

What is needed is a low temperature (i.e., less than 475 degrees C.) deposition process which provides an amorphous carbon layer having a high optical extinction coefficient at the wavelength of the laser anneal step (i.e., an extinction coefficient greater than 0.35 at a wavelength of 81 nm) and which is impervious to mechanical failure such as peeling or separation at the temperature of the laser annealing step (e.g., 1150 to 1350 degrees C.), and which has excellent step coverage. Such a process has not seemed possible.

SUMMARY OF THE INVENTION

A plasma enhanced physical vapor deposition process deposits an amorphous carbon layer on an ion-implanted wafer for use in dynamic surface annealing of the wafer with an intense line beam of a laser wavelength. The deposition process is carried out at a wafer temperature below the dopant clustering threshold temperature, and includes introducing the wafer into a chamber and furnishing a hydro-carbon process gas into the chamber, preferably acetylene ($C_2H_2$) or a mixture of acetylene and methane ($C_2H_4$). The process further includes inductively coupling RF plasma source power into the chamber while and applying RF plasma bias power to the wafer. The wafer bias voltage is set to a level at which the amorphous carbon layer that is deposited has a desired stress (compressive or tensile). We have discovered that at a wafer temperature of less than or equal to 475 degrees C., Total top and side RF plasma source power of 4000 Watts at about 2 MHz, RF plasma bias power of 2000-3000 Watts at about 13.56 Hz and a chamber pressure in a range of 3 mTorr to 2 Torr, the deposited amorphous carbon layer has a surprising combination of qualities. Specifically, despite the low wafer temperature during deposition, the amorphous carbon layer has both a very high optical extinction coefficient (0.5) at 810 nm while being impervious to damage or peeling during the subsequent laser anneal step in which the local wafer surface temperature may reach as high as 1350 degrees C. or higher. Furthermore, the step coverage of the deposited amorphous carbon layer is 100%, meaning that the side wall thickness and the horizontal surface thickness of the deposited layer are the same. Finally, the stress in the amorphous carbon layer may be adjusted to a desired tensile or compressive level by adjusting the applied RF plasma bias power. This combination of qualities in an amorphous carbon optical absorber layer are unprecedented and unexpected.

DETAILED DESCRIPTION OF THE INVENTION

Introduction:

We have discovered a process that meets all of the requirements for ion implantation and annealing of semiconductor structures having 45 nm feature sizes. This process employs ion implantation by suitable conventional processes (e.g., plasma immersion ion implantation and/or beam ion implantation), deposition of an amorphous carbon layer (ACL) for uniform optical absorption followed by dynamic surface annealing by a scanned laser line beam. Our process overcomes all the obstacles that have limited the prior art by depositing an ACL at a low wafer temperature (below the dopant clustering threshold temperature) in such a manner that the ACL has a high optical extinction coefficient at the laser wavelength, and has sufficient adhesion and strength to avoid damage during the laser anneal step. We have discovered that deposition of an ACL having a high extinction coefficient at 810 nm capable of withstanding laser annealing is performed using high density plasma chemical vapor deposition at a wafer temperature less than or equal to 475 degrees C. One surprise is that the a high extinction coefficient for 810 nm with high mechanical strength is obtained in the amorphous carbon layer at such a low wafer temperature during deposition.

Figure 1:
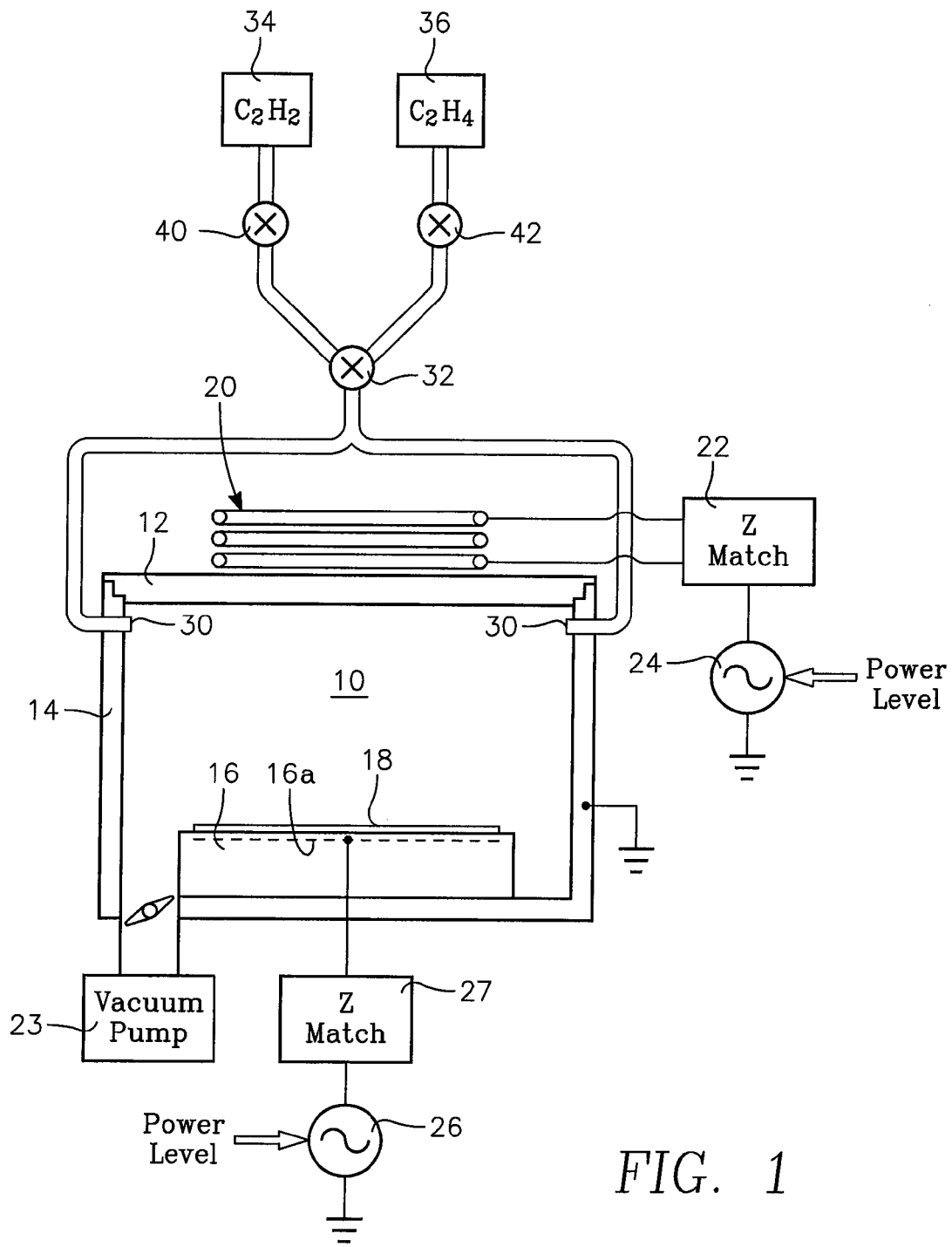
FIG. 1 is a simplified diagram of a physical vapor deposition plasma chamber employed in carrying out some steps in the process of the invention.
Figure 2:
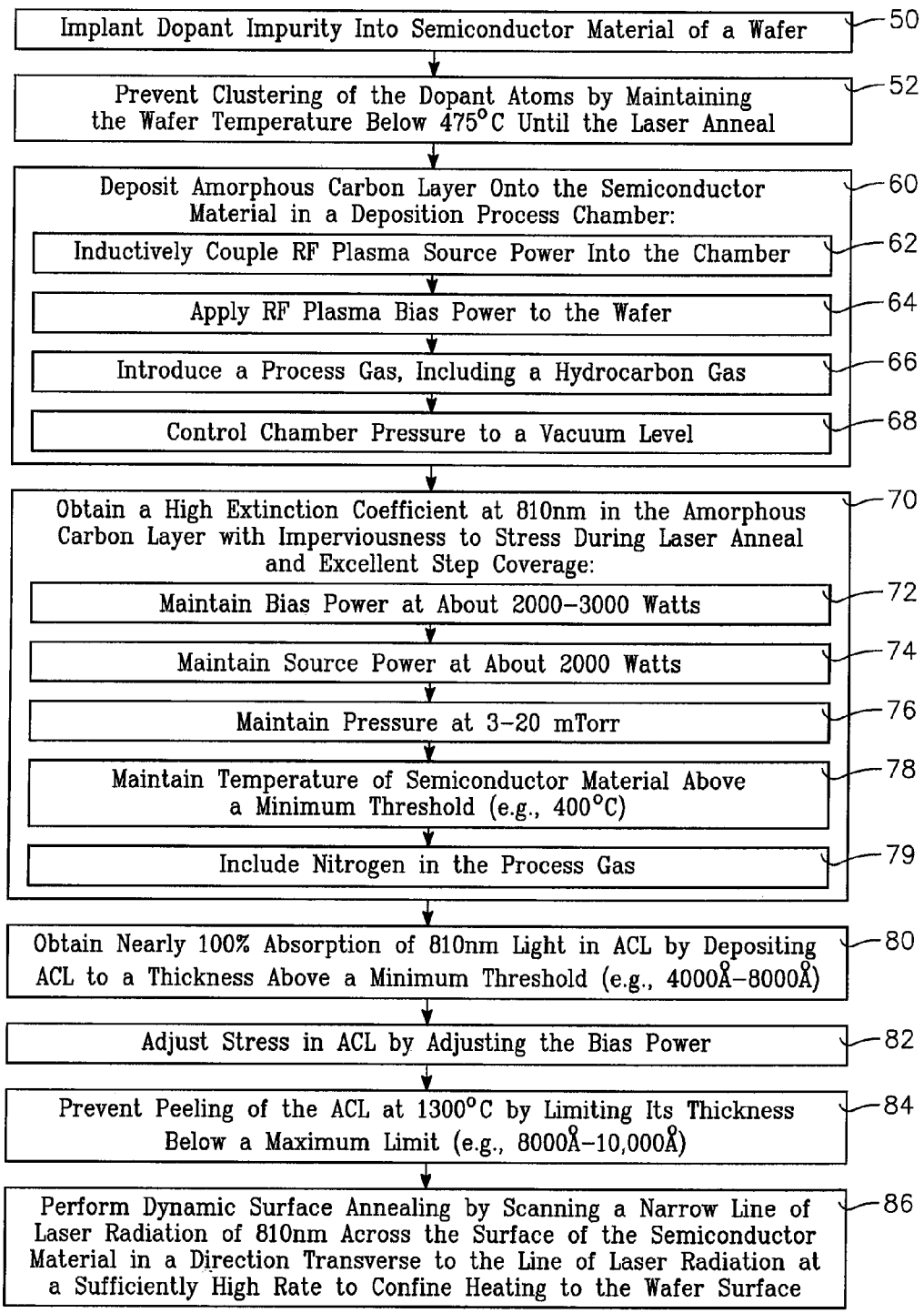
FIG. 2 is a block diagram depicting a process embodying the invention.

Deposition of ACL with Optimum Optical Qualities, Optimum Mechanical Strength and Excellent Step Coverage:

FIG. 1 depicts a plasma reactor chamber for carrying out the high density plasma chemical vapor deposition process for forming a highly adhesive ACL having a high extinction coefficient at 810 nm. FIG. 2 is a flow diagram of the ACL deposition process. The chamber depicted in FIG. 1 is defined by a vacuum envelope 10 including a ceiling 12 and sidewall 14. A wafer support pedestal 16 supports a semiconductor wafer or workpiece 18 at the floor of the chamber 10 facing the ceiling 12. An overhead coil antenna (or inductive power applicator) 20 may be located over the ceiling 12 facing the wafer support pedestal 16. The ceiling 12 is constructed so as to permit inductive coupling of RF power into the chamber from the coil antenna 20. For example, while the side wall 14 may be formed of metal, the ceiling 12 may be formed of an insulator material. A vacuum pump 23 evacuates the chamber to maintain desired chamber pressure. An RF plasma source power generator 24 is coupled to the coil antenna 20 through an impedance match element 22. The power level of the source power generator 24 is sufficiently high and the chamber pressure established by the vacuum pump 23 is sufficiently low to generate a high density plasma in the chamber, typically one having an ion density in excess of $10^9$ cm$^{-3}$, preferably over $10^{10}$ cm$^{-3}$ and as high as $10^{11}$ cm$^{-3}$. An RF plasma bias power generator 26 applies RF bias power through an impedance match element 27 to an internal electrode 16a the wafer support pedestal 16. Gas injection orifices 30 receive a hydrocarbon process gas from a mass flow controller 32 which is supplied from acetylene and methane gas supplies 34, 36 through individual mass flow controllers 40, 42.

Referring now to FIG. 2, the semiconductor junction formation process begins by ion implanting a dopant impurity (e.g., boron or arsenic) into the surface of the semiconductor wafer (block 50 of FIG. 2). This step may be carried out by plasma immersion ion implantation or beam ion implantation or a combination of both. Thereafter, and throughout the process, the wafer temperature is maintained below about 475 degrees C. to prevent clustering of the implanted dopant atoms (block 52 of FIG. 2). An amorphous carbon layer (ACL) is deposited as an optical absorber layer on the wafer in a high density plasma chemical vapor deposition process carried out in the reactor of FIG. 1 (block 60 of FIG. 2). This step entails placing the wafer 18 on the wafer pedestal 16, inductively coupling plasma source power from the source power generator 24 into the chamber (block 62 of FIG. 2), applying bias power to the wafer pedestal 16 from the bias power generator 26 (block 64 of FIG. 2), and introducing the process gas through the gas injection orifices 30 (block 66), while maintaining a desired chamber pressure using the vacuum pump 23 (block 68 of FIG. 2).

During this step, certain measures are carried out to ensure that the deposited ACL has both high extinction coefficient (e.g., at least 0.5) at 810 nm and sufficient adhesion and strength to withstand the laser anneal process as high as 1350 degrees C. (block 70 of FIG. 2):

the output level of the bias power generator 26 is set within a range of about 2 kW to 3 kW (block 72) while the output level of the source power generator 24 is set to about 4 kW (block 74 of FIG 2) and the chamber pressure is maintained within a range of about 3 mT to 2 T (block 76);

the amount of hydrogen contained in the deposited ACL is limited sufficiently to ensure the formation of predominantly double-carbon bonds throughout the ACL or prevent or suppress formation of single carbon bonds, by increasing the ratio of propylene to methane or toluene to methane or acetylene to methane (or eliminating methane) dissolved in the carrier gas, or, equivalently, using a process gas having a high ratio of carbon-to-hydrogen;

heating the wafer 18 to a sufficiently high temperature (but less than the dopant clustering threshold temperature) to attain the desired extinction coefficient at 810 nm (block 78);

promoting the formation of carbon-nitrogen bonds in the ACL by adding nitrogen to the hydrocarbon process gas, e.g., as much as 3% (block 79 of FIG 2).

The ACL is deposited to a sufficient thickness for the ACL be able to absorb all of the laser radiation, e.g., to a thickness between about 4000 Angstroms and 8000 Angstroms (block 80 of FIG. 2). Stress in the ACL is adjusted between a tensile stress and a compressive stress by adjusting the output power level of the bias generator 26 during the deposition process (block 82 of FIG. 2). As bias power increases, the stress becomes more tensile and less compressive, and as bias power decreases, the stress becomes less tensile and more compressive. The thickness of the ACL is limited to minimize magnitude of stress in the ACL during laser annealing (block 84 of FIG. 2). For this purpose, the upper limit on the ACL thickness is about 8,000-10,000 Angstroms.

Upon completion of the ACL deposition, the wafer is transferred to a dynamic surface anneal apparatus for laser annealing (block 86 of FIG. 2), which is described below.

Figure 3:
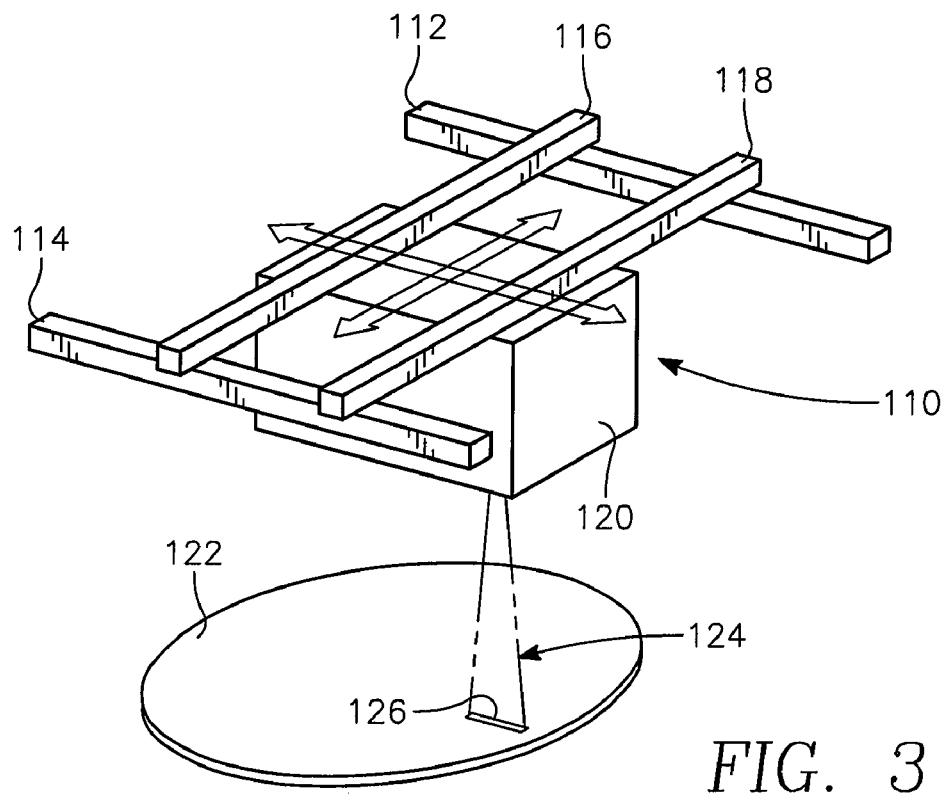
FIG. 3 illustrates a dynamic surface annealing apparatus employed in carrying out other steps in the process of FIG. 2.

Dynamic Surface Annealing:

The dynamic surface anneal step uses a large array of CW 810 nm diode lasers to produce a single intense beam of light that is projected on the wafer surface as a thin long line of radiation. The line is then scanned over the surface of the wafer in a direction perpendicular to the long dimension of the line beam. One embodiment of the light source is illustrated in the schematic orthographic representation of FIG. 3. A gantry structure 110 for two-dimensional scanning includes a pair of fixed parallel rails 112, 114. Two parallel gantry beams 116, 118 are fixed together a set distance apart and supported on the fixed rails 112, 114 and are controlled by an unillustrated motor and drive mechanism to slide on rollers, source, or ball bearings together along the fixed rails 112, 114. A beam source 120 is slidably supported on the gantry beams 116, 118, e.g. suspended below the beams 116, 118 and is controlled by unillustrated motors and drive mechanisms to slide along them. A silicon wafer 122 or other substrate is stationarily supported below the gantry structure 110. The beam source 120 includes laser light source and optics to produce a downwardly directed fan-shaped beam 124 that strikes the wafer 122 as a line beam 126 extending generally parallel to the fixed rails 112, 114, in what is conveniently called the slow direction. Although not illustrated here, the gantry structure further includes a Z-axis stage for moving the laser light source and optics in a direction generally parallel to the fan-shaped beam 124 to thereby controllably vary the distance between the beam source 120 and the wafer 122 and thus control the focusing of the line beam 126 on the wafer 122. Exemplary dimensions of the line beam 126 include a length of 1 cm and a width of 100 microns with an exemplary power density of 400 kW/cm$^2$. Alternatively, the beam source and associated optics may be stationary while the wafer is supported on a stage which scans it in two dimensions.

In typical operation, the gantry beams 116, 118 are set at a particular position along the fixed rails 112, 114 and the beam source 120 is moved at a uniform speed along the gantry beams 116, 118 to scan the line beam 126 perpendicularly relative to its long dimension in a direction conveniently called the fast direction. The line beam 126 is thereby scanned from one side of the wafer 122 to the other to irradiate a 1 cm swath of the wafer 122. The line beam 126 is narrow enough and the scanning speed in the fast direction fast enough that a particular area of the wafer is only momentarily exposed to the optical radiation of the line beam 126 but the intensity at the peak of the line beam is enough to heat the surface region to very high temperatures. However, the deeper portions of the wafer 122 are not significantly heated and further act as a heat sink to quickly cool the surface region.

Once the fast scan has been completed, the gantry beams 116, 118 are moved along the fixed rails 112, 114 to a new position such that the line beam 126 is moved along its long dimension extending along the slow axis. The fast scanning is then performed to irradiate a neighboring swath of the wafer 122. The alternating fast and slow scanning are repeated, perhaps in a serpentine path of the beam source 120, until the entire wafer 122 has been thermally processed.

Figure 4:
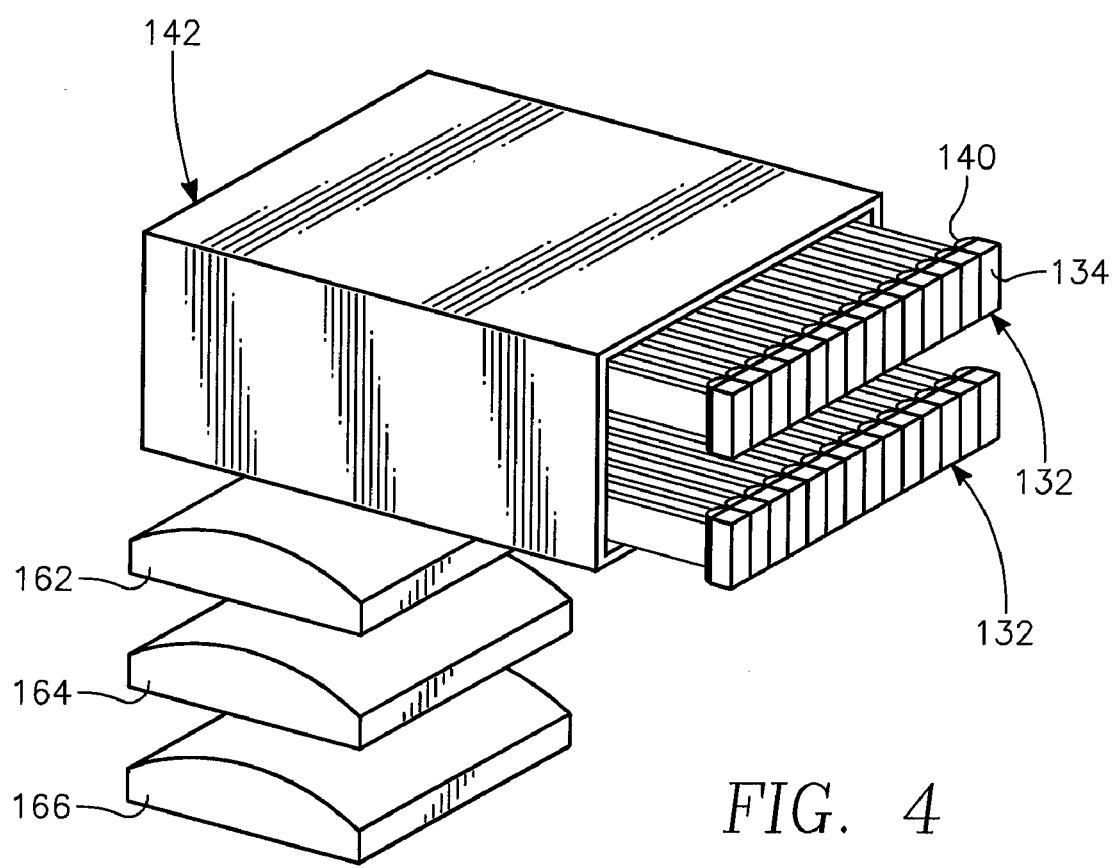
FIG. 4 is a top view of the optics of the apparatus of FIG. 3.
Figure 5:
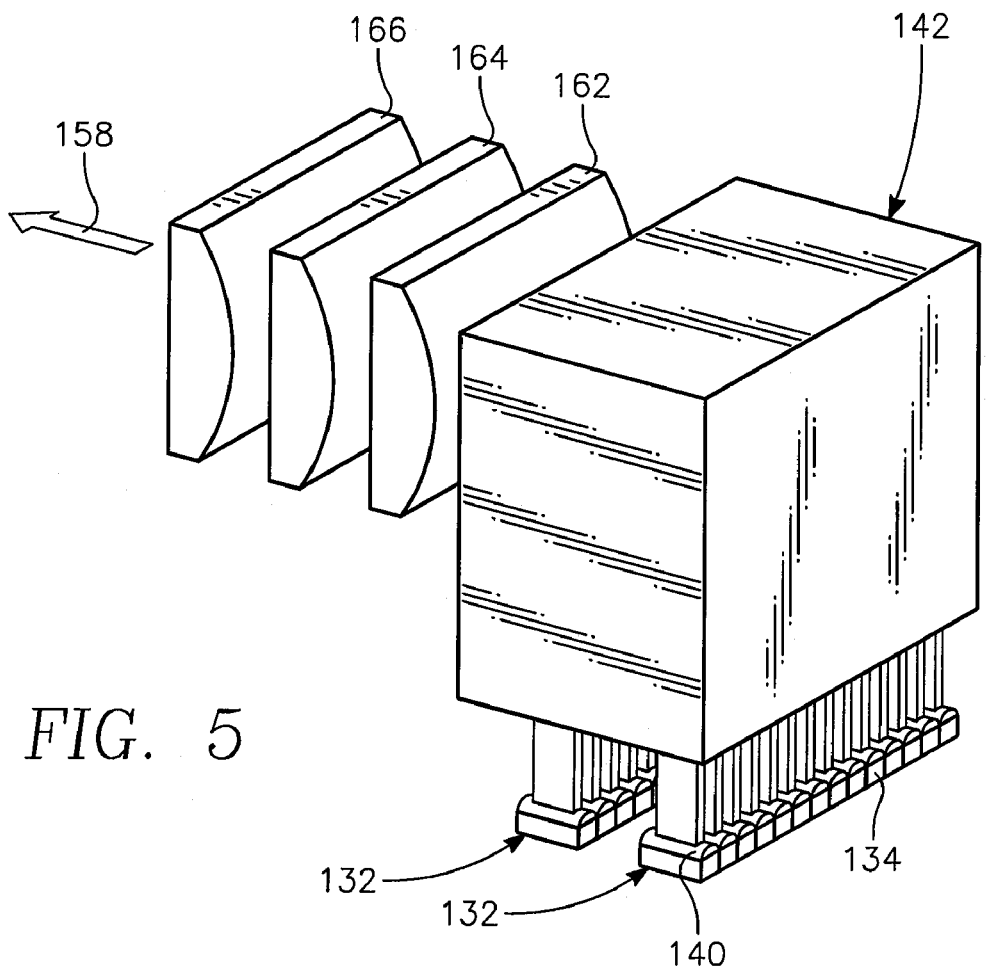
FIG. 5 is an elevational view corresponding to FIG. 4.
Figure 6:
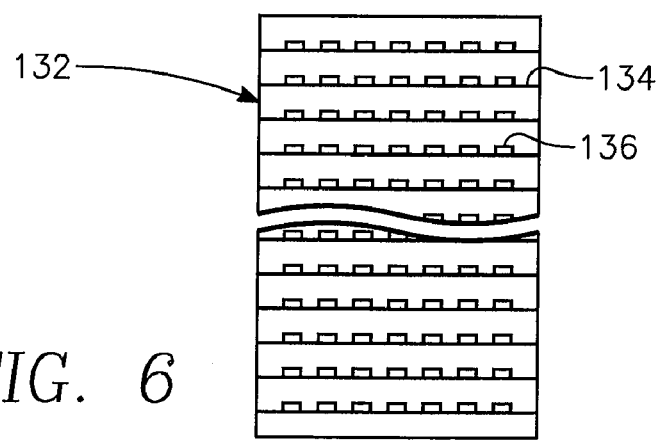
FIG. 6 is a broken sectional view of the laser array employed in the apparatus of FIG. 3.

One example of optics beam source 120, orthographically illustrated in FIGS. 4 and 5, receives laser radiation at about 810 nm from two laser bar stacks 132, one of which is illustrated in end plan view in FIG. 6. Each laser bar stack 132 includes 14 parallel bars 134, generally corresponding to a vertical p-n junction in a GaAs semiconductor structure, extending laterally about 1 cm and separated by about 0.9 mm. Typically, water cooling layers are disposed between the bars 134. In each bar 134 are formed 49 emitters 136, each constituting a separate GaAs laser emitting respective beams having different divergence angles in orthogonal directions. The illustrated bars 134 are positioned with their long dimension extending over multiple emitters 136 and aligned along the slow axis and their short dimension corresponding to the less than 1-micron p-n depletion layer aligned along the fast axis. The small source size along the fast axis allows effective collimation along the fast axis. The divergence angle is large along the fast axis and relatively small along the slow axis.

Returning to FIGS. 4 and 5, cylindrical lenslets 140 are positioned along the laser bars 134 to collimate the laser light in a narrow beam along the fast axis. They may be bonded with adhesive on the laser stacks 132 and aligned with the bars 134 to extend over the emitting areas 136. The two sets of beams from the two bar stacks 132 are input to conventional optics 142. The source beam 158 is then passed through a set of cylindrical lenses 162, 164, 166 to focus the source beam 158 along the slow axis.

The foregoing dynamic laser annealing step anneals the implanted dopant atoms to move them from substitutional positions in the crystal of the wafer into interstitial positions, thus activating the dopants. This annealing process optionally may be supplemented by broadband annealing step employing a broadband radiation source, such as flash lamps, for example, either before or after the dynamic laser annealing step. The broadband annealing step consists of exposing the wafer surface to a broadband light source having a radiation spectrum that includes a wavelength range at which the ACL layer has an absorption coefficient of about 0.3. The power and duration of the exposure to the broadband radiation source is sufficient to raise the wafer surface temperature above 1150 to 1350 degrees C. for 50 microsec to 3 millisec. The broadband radiation source can have a radiation spectrum ranging from 300 nm to 1100 nm, or including that range.

Working Example:

The following is a working example of the high density plasma chemical vapor deposition (HDPCVD) process of block 60 of FIG. 2. In this example, no nitrogen was present in the process gas, the process gas consisting primarily of acetylene. The process parameters were set as follows: RF plasma source power: 2,000 Watts at 2 MHz, chamber pressure: 3 mTorr, RF bias power: 2000 Watts at 13.56 MHz, process gas: Acetylene, wafer temperature: 400 degrees C. The characteristics of the ACL deposited in this example were as follows: extinction coefficient at 810 nm wavelength: 0.55, thickness: 4000 Angstroms, deposition rate: 2550 Angstroms/minute, step coverage: 100%, sidewall thickness to top thickness ratio: 100%, bottom thickness to top thickness ratio: 100%, deviation across wafer: less than 5%, damage at 1300 degrees C. during laser annealing: none.

The extinction coefficient at 810 nm obtained in the working example is 50% greater than that obtained in the high temperature PECVD process described in the background discussion above. This improvement permits the ACL thickness to be reduced by a similar factor to obtain the same percentage absorption of the incident laser power (e.g., 90-99%). For a given absorption (e.g., 99%) of the incident laser power in the ACL, the required ACL thickness depends directly upon the extinction coefficient. For example, in order to absorb 99% of the incident laser power, an ACL with an extinction coefficient of 0.55 must be 5400 Angstroms thick while an ACL with an extinction coefficient of only 0.35 (obtained in the conventional PECVD process described in the background discussion above) must be 8700 Angstroms thick. The dramatic reduction in required ACL thickness achieved in the present invention (by the improvement in extinction coefficient) renders the ACL much more durable and impervious to peeling, separation or cracking during the laser annealing step. This is because the stress on the ACL laser during its inevitable expansion and contraction with the scanning laser line beam is a direct function of the ACL thickness. Therefore, the improvement in extinction coefficient obtained in the invention has the direct advantage of higher or more efficient absorption and the indirect advantage of permitting a thinner ACL to reduce stress during the laser anneal.

Several process parameters are exploited in our process to produce an ACL with a higher extinction coefficient at 810 nm. First, the extinction coefficient is improved by adjusting process conditions during the HDPCVD process 60 of FIG. 2 to promote the greatest proportion of double carbon bonds in the ACL. One way of accomplishing this is to minimize the amount of hydrogen in the process gas. In the working example given above, this was accomplished by using a hydrocarbon gas (acetylene) having a low (1:1) ratio of hydrogen to carbon atoms. Another way of enhancing the extinction coefficient is to include a small amount of nitrogen in the process gas. This promotes the formation of carbon-nitrogen bonds in the ACL, which contribute to optical absorption at 810 nm. In the second example, the process gas contained 3% nitrogen.

The wafer temperature during the HDPCVD step 60 of FIG. 2 may be increased to improve step coverage of the ACL provided the wafer temperature is maintained below 475 degrees C.

While the invention has been described in detail by specific reference to preferred embodiments, it is understood that variations and modifications thereof may be made without departing from the true spirit and scope of the invention.

What is claimed is:

1. A process for forming semiconductor junctions in a wafer, comprising:
   ion implanting dopant impurity atoms into the surface of the wafer;
   depositing an amorphous carbon layer on said wafer by the following steps:
   (a) introducing the wafer into a reactor chamber and introducing a hydrocarbon process gas into the chamber;
   (b) inductively coupling RF plasma source power into the chamber and applying RF plasma bias power to the wafer,
   (c) setting said bias power in a range between about 2 kW and 3 kW and setting said total source power in a range centered around 4 kW while maintaining pressure in said chamber in a range of 3 mTorr to 2 Torr to deposited an amorphous carbon layer on said wafer having an extinction coefficient in excess of 0.3 for light in a wavelength range that includes a laser wavelength; and
   generating a line beam from an array of CW lasers operating at said laser wavelength and annealing the implanted dopant atoms in the wafer surface by scanning the line beam across the wafer surface in a direction transverse to the line beam, said line beam having sufficient power to raise the wafer surface temperature in the zone of said line beam above 1150 to 1350 degrees C. for 50 microsec to 3 millisec.

2. The process of claim 1 further comprising:
   exposing said wafer surface to a broadband light source having a radiation spectrum that includes said wavelength range with sufficient power to raise the wafer surface temperature above 1150 to 1350 degrees C. for 50 microsec to 3 millisec.

3. The process of claim 1 wherein said laser wavelength is 810 nm.

4. The process of claim 2 wherein said broadband light source comprises broadband radiation source flash lamps with radiation spectrum ranging from 300 nm to 1100 nm.

5. The process of claim 1 wherein said chamber pressure is sufficiently low and said RF source power is sufficiently great to facilitate a high density plasma in said chamber having an ion density of at least about $10^{10}$ ions per cubic centimeter.

6. The process of claim 1 wherein said bias power is between about 2 kW and 3 kW.

7. The process of claim 1 wherein process gas comprises acetylene.

8. The process of claim 1 wherein process gas comprises propylene.

9. The process of claim 1 wherein process gas comprises toluene.

10. The process of claim 7 wherein said process gas further comprises methane.

11. The process of claim 7 wherein said process gas further comprises nitrogen.

12. The process of claim 1 further comprising including nitrogen in said amorphous carbon layer.

13. The process of claim 12 wherein the step of including nitrogen in said amorphous carbon layer is carried out by adding nitrogen gas to said process gas.

14. The process of claim 12 wherein said process gas comprises about 97% hydrocarbon gas and about 3% nitrogen.

15. The process of claim 1 further comprising heating the wafer during the deposition process to less than 475 degrees C.

16. The process of claim 1 wherein the step of depositing an amorphous carbon layer further comprises limiting the final thickness of said layer to a minimum thickness required to obtain 100 percent absorption of said line beam.

17. The process of claim 16 wherein said extinction coefficient is about 0.55 and the thickness of said amorphous carbon layer is limited to about 5400 Angstroms.

18. The process of claim 1 further comprising adjusting the stress in said amorphous carbon layer between a tensile stress and a compressive stress by controlling said bias power.

19. The process of claim 1 further comprising minimizing the proportion of hydrogen to carbon in the process gas.

* * * * *